United States Patent
Mori et al.

(10) Patent No.: US 6,653,855 B2
(45) Date of Patent: Nov. 25, 2003

(54) EXTERNAL TEST AUXILIARY DEVICE TO BE USED FOR TESTING SEMICONDUCTOR DEVICE

(75) Inventors: Hisaya Mori, Hyogo (JP); Shinji Yamada, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 58 days.

(21) Appl. No.: 09/927,366

(22) Filed: Aug. 13, 2001

(65) Prior Publication Data

US 2002/0118007 A1 Aug. 29, 2002

(30) Foreign Application Priority Data

Feb. 8, 2001 (JP) ........................................ 2001-032849

(51) Int. Cl.⁷ .............................................. G01R 31/02
(52) U.S. Cl. .................................... 324/763; 324/158.1
(58) Field of Search ................................ 324/765, 755, 324/763, 158.1, 73.1; 714/738.742

(56) References Cited

U.S. PATENT DOCUMENTS 3,667,037 A * 5/1972 Kierce ........................ 324/72.5
3,870,953 A * 3/1975 Boatman et al. ............ 324/72.5
4,998,250 A * 3/1991 Kohlmeier et al. ............ 714/27
6,154,715 A * 11/2000 Dinteman et al. ........... 702/120

FOREIGN PATENT DOCUMENTS

JP    08-233912    9/1996
JP    09-189750    7/1997

* cited by examiner

*Primary Examiner*—Kamand Cuneo
*Assistant Examiner*—Tung X. Nguyen
(74) *Attorney, Agent, or Firm*—McDermott, Will & Emery (57) ABSTRACT

A BOST (built-off self-test) board has a connector, a substrate for use with a BOST board, and an external self-test circuit. The external self-test circuit has an ADC (analog-to-digital converter)/DAC (digital-to-analog converter) measurement section and a DSP (digital signal processor). In accordance with a control signal input by way of a specific terminal provided in a connector, the ADC/DAC measurement section transmits a predetermined test signal to the specific terminal provided in the connector. Further, in response to the test signal, the ADC/DAC measurement section receives a response signal input to the specific terminal provided in the connector. The DSP analysis section analyzes the response signal, thereby determining whether or not the response signal is an appropriate signal. Further, the DSP analysis section transmits, to the specific terminal provided in the connector, a test result signal indicating whether or not the response signal is appropriate.

4 Claims, 9 Drawing Sheets

Fig. 9A  ADDRES

Fig. 9B  Test Signal

Fig. 9C  DUT DAC

Fig. 9D  BOST ADC

Fig. 9E  BUSY

Fig. 9F  WRITE

Fig. 9G  DAC Count Signal

Fig. 9H  Address Count Signal

EXTERNAL TEST AUXILIARY DEVICE TO BE USED FOR TESTING SEMICONDUCTOR DEVICE

BACKGROUND OF THE INVENTION

1. Field of the Invention

The present invention relates to an external test auxiliary device to be used for testing a semiconductor device, and more particularly, to an external auxiliary device suitable for improving measurement performance of LSI test equipment (called a "tester") and for expanding the function of the tester.

2. Description of the Background Art

In relation to a system LSI; that is, an LSI consisting of a single chip or a combination of chips into which a plurality of circuit modules are functionally placed, hybridization of digital circuits and analog circuits has been pursued. In order to cope with such a situation, testers capable of handling a mixed signal; i.e., a mixed signal consisting of an analog signal and a digital signal, have been developed. These testers have high-performance specifications and are usually expensive.

A conceivable another solution for handling the mixed signal is testing of a system LSI utilizing an existing low-cost tester; e.g., a tester for a logic LSI. Use of such a method is likely to raise problems in a characteristics test of an analog circuit for which higher precision is pursued; more specifically, in a characteristics test pertaining to a digital-to-analog converter (DAC) or analog-to-digital converter (ADC).

Figure 11:
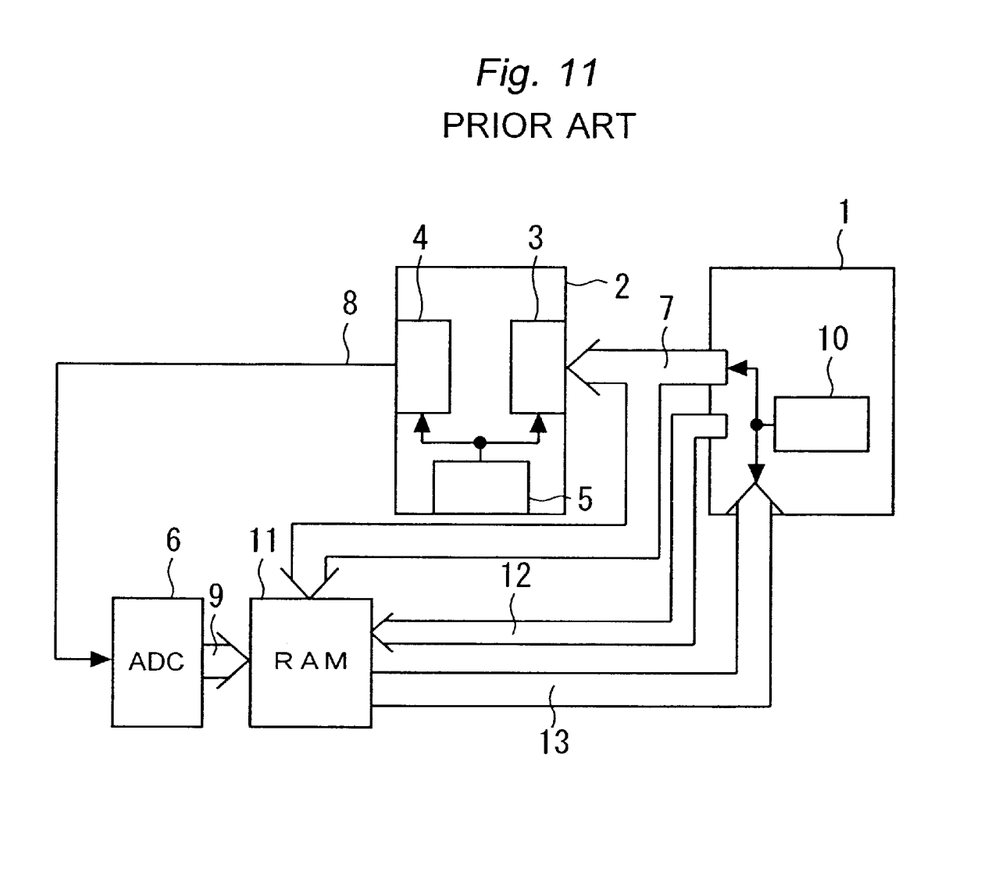
FIG. 11 is a block diagram for describing one example of a related-art method for testing characteristics of a DAC incorporated in a DUT.

FIG. 11 is a block diagram for describing one example of a related-art method for testing characteristics of a DAC incorporated in a semiconductor device under test (hereinafter simply called a "DUT"). As shown in FIG. 11, reference numeral 1 designates a tester; and 10 designates a CPU provided in the tester 1. Further, reference numeral 2 designates a DUT. The DUT 2 has a DAC 3, an output section 4, and a CPU 5.

A digital signal 7 output from the tester 1 is supplied to the DAC 3 of the DUT 2. The digital signal 7 is converted into an analog signal by means of the DAC 3, and the analog signal is supplied to the output section 4. An analog signal 8 output from the output section 4 is supplied to RAM 11 after having been converted into a digital signal 9 by means of an ADC 6 provided outside the DUT 3.

A digital signal 7 identical with that supplied to the DUT 2 and a control signal 12 for controlling the operation of the RAM 11 (i.e., an address signal or a read/write signal) are supplied to the RAM 11 from the tester 1. The digital signal 7 and the digital signal 9 generated from the former are recorded in the RAM 11. After all tests to be conducted have been completed, record data pertaining to the tests are uploaded to the tester 1 as a digital signal 13. The tester 1 analyzes the thus-uploaded digital signal 13, thereby determining whether or not the DAC 3 of the DUT 2 is performing digital-to-analog conversion operation appropriately.

As mentioned above, according to the test method shown in FIG. 11, although the tester 1 has no function of handling an analog signal, the tester 1 can suitably conduct a test of the DAC 3 provided in the DUT 2.

However, when the test circuit shown in FIG. 11 is constituted through use of a popular tester, a plurality of connection elements; specifically, a DUT board on which the DUT 2 is to be mounted and a cable for connecting the DUT board to the tester 1, are provided in a pathway from a measurement device provided in the tester 1 to the DUT 2. Further, a long signal path is established between the measurement device provided in the tester 1 and the DUT 2. These connection elements and/or the long signal path account for occurrence of noise and deteriorate precision of measurement performed during a test.

Under the test method shown in FIG. 11, the digital signals 7 and 13 and the control signal 12 must be exchanged between the tester 1 and the RAM 11. Under this method, a plurality of pin electronics provided on the tester 1 are occupied for testing a single DUT 2. In this regard, the related-art test method suffers a great disadvantage as a method of simultaneously testing a plurality of semiconductor devices.

The related-art method further requires the tester 1 to perform all processing operations required for testing the DUT 2. For this reason, processing speed of the tester 1 cannot be improved. Moreover, the test method shown in FIG. 11 requires uploading of measurement data accumulated in the RAM 11 to the tester 1 after completion of a desired test. In this way, the related-art test method is not necessarily suitable for testing the DUT 2 at high speed.

SUMMARY OF THE INVENTION

The present invention has been conceived to solve these drawbacks and is aimed at providing an external test auxiliary device which can increase the processing speed of a tester to be used for testing a semiconductor device and expand the functions of the tester, which is less susceptible to influence of noise, and which enables high-speed testing of a semiconductor device.

The above objects of the present invention are achieved by an external test auxiliary device described below. The device includes a connector having a plurality of terminals. The connector is mounted on a BOST (built-off self-test) board substrate. An external self-test circuit is also formed on the BOST board substrate. The external self-test circuit includes a test signal transmission section which transmits a predetermined test signal to a specific terminal provided in the connector on the basis of a control signal input from the specific terminal provided in the connector. The external self-test circuit also includes a response signal receiving section which, in response to the test signal, receives a response signal input to a specific terminal provided in the connector. Further, the external self-test circuit includes a signal analysis section which analyzes the response signal, thereby determining whether or not the signal is an appropriate signal as well as a result signal transmission section which transmits, to a specific terminal provided in the connector, a test result signal representing whether or not the response signal is appropriate.

The above objects of the present invention are also achieved by an external test auxiliary device described below. The device includes a DUT (device under test) socket on which a semiconductor device under test is to be mounted. The DUT socket is mounted on a DUT board substrate. An external self-test circuit formed on the DUT board substrate. The DUT board substrate includes a plurality of connection terminals for establishing an electrical connection with a plurality of pins provided on a test head of a semiconductor tester. The DUT board substrate also includes a circuit element for establishing a desired electrical connection between the plurality of connection terminals, terminals of the DUT socket, and a plurality of circuit terminals of the external self-test circuit. The self-test circuit includes a test signal transmission section which transmits a predetermined test signal to a specific circuit terminal in accordance with a control signal input by way of a specific circuit terminal. The self-test circuit also includes a response signal receiving section for receiving, in response to the test signal, a response signal input to a specific circuit terminal. The self-test circuit further includes a signal analysis section which analyzes the response signal and determines whether or not the signal is an appropriate signal as well as a result signal transmission section for transmitting, to a specific circuit terminal, a test result signal representing whether or not the response signal is appropriate.

The above objects of the present invention are further achieved by an external test auxiliary device described below. The device includes a probe card having a plurality of probes to be brought into contact with a semiconductor wafer under test. An external self-test circuit is formed on the probe card. The probe card includes a plurality of connection terminals for establishing an electrical connection with a plurality of pins provided on a test head of a semiconductor tester. The prove card also includes a circuit element for establishing a desired electrical connection between the plurality of connection terminals, the plurality of terminals of the probe, and the plurality of circuit terminals of the external self-test circuit. The self-test circuit includes a test signal transmission section which transmits a predetermined test signal to a specific circuit terminal in accordance with a control signal input by way of a specific circuit terminal. The self-test circuit also includes a response signal receiving section for receiving, in response to the test signal, a response signal input to a specific circuit terminal. The self-test circuit further includes a signal analysis section which analyzes the response signal and determines whether or not the signal is an appropriate signal as well as a result signal transmission section for transmitting, to a specific circuit terminal, a test result signal representing whether or not the response signal is appropriate.

Other objects and further features of the present invention will be apparent from the following detailed description when read in conjunction with the accompanying drawings.

DESCRIPTION OF THE PREFERRED EMBODIMENTS

In the following, principles and embodiments of the present invention will be described with reference to the accompanying drawings. Throughout the drawings, like reference numerals designate like elements, and repeated explanations thereof are omitted.

First Embodiment

Figure 1A:
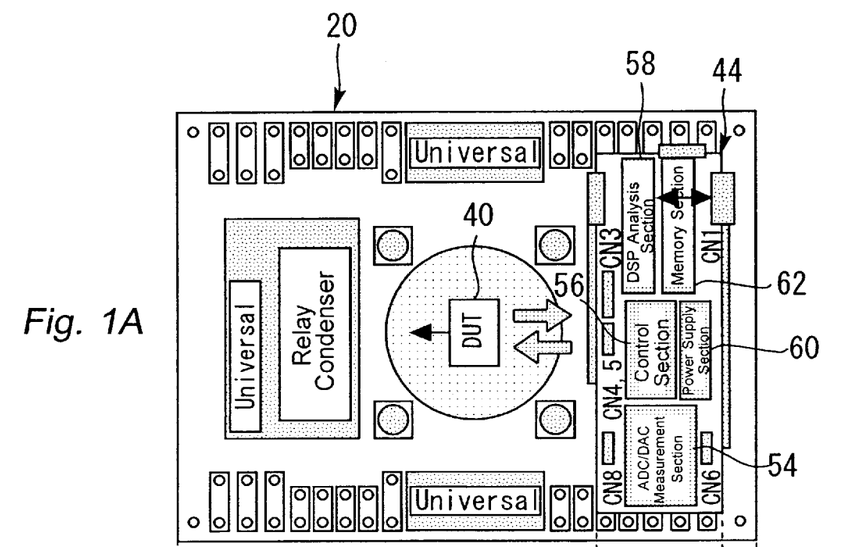
FIG. 1A is a plan view showing a DUT board used for a test method according to a first embodiment of the present invention.
Figure 1B:
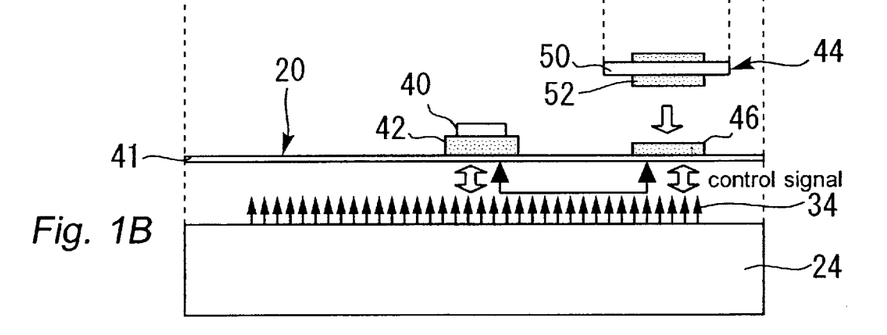
FIG. 1B is a side view of the DUT board shown in FIG. 1A.

FIGS. 1A and 1B are illustrations for describing a test method according to a first embodiment of the present invention. More specifically, FIG. 1A is a plan view showing a DUT board 20 used for the test method according to the first embodiment, and FIG. 1B is a side view of the DUT board 20 shown in FIG. 1A.

Figure 2:
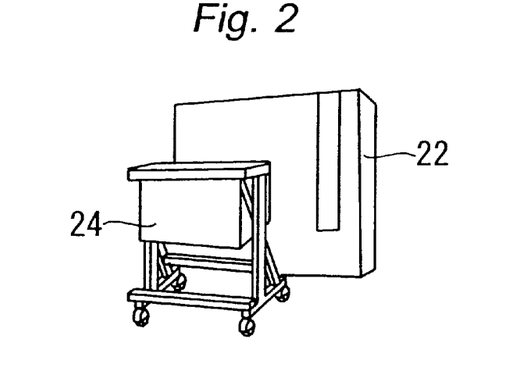
FIG. 2 is a perspective view showing an LSI test apparatus (tester) employed in the first embodiment.
Figure 3:
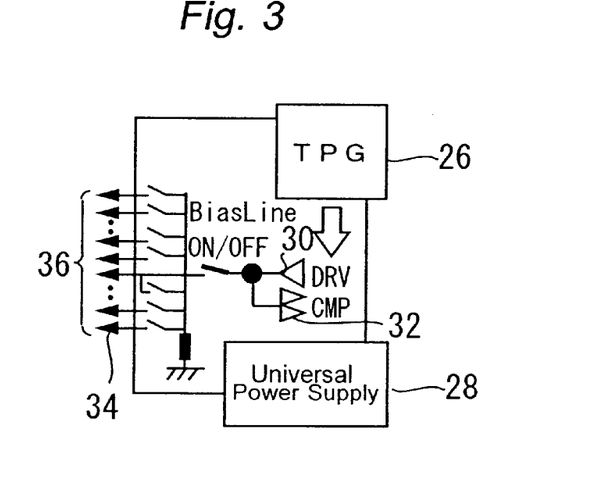
FIG. 3 is a schematic diagram simply showing the configuration of the tester shown in FIG. 2.

FIG. 2 is a perspective view showing an LSI test apparatus 22 (called tester hereunder 22). FIG. 3 is a schematic diagram simply showing the configuration of the tester 22.

As shown in FIG. 2, a test head 24 is connected to the tester 22. As shown in FIG. 3, the tester 22 has built therein a test pattern generator (TPG) 26, a universal power supply 28, a drive circuit 30, and a comparator 32. A pin section 36 having a plurality of pins (needle-shaped electrodes) 34 is provided on the test head 24. The pins 34 are connected to the driver circuit 30 and the comparator 32 in an electrically continuous manner by way of a switching circuit 38.

The DUT board 20 shown in FIGS. 1A and 1B is an interface unit for establishing a desirable electrical connection between the tester 22 and a DUT 40 (a semiconductor device under test) when the DUT 40 is tested through use of the tester 22. The DUT board 20 has a DUT board substrate 41. In the present embodiment, the DUT board substrate 41 has a DUT socket 42 to be used for mounting the DUT 40, and a BOST (built-off self-test) socket 46 to be used for mounting a BOST board 44.

As shown in FIG. 1B, the DUT 40 is tested with the DUT socket 42 being mounted on the DUT 40, the BOST socket 46 being mounted on the BOST board 44, and the DUT board 20 being mounted on the test head 24. The DUT board substrate 41 has a connection terminal to be electrically connected to the individual pins 34 provided on the test head 24, and a wiring element for establishing a desirable electrical connection between the connection terminal, the terminal of the DUT socket 42, and the terminal of the BOST socket 46. Accordingly, the DUT 40 is tested while the pins 34 provided on the test head 24, terminals of the DUT 40, and terminals of the BOST board 44 are electrically connected with each other in an appropriate manner.

In the present embodiment, the BOST board 44 acts as an external test auxiliary device for supplementing the capability of the tester 22 at the time of testing of the DUT 40.

The BOST board 44 supplies a test signal produced therein to the DUT 40 and analyzes the response of the DUT 40 to the test signal, thus performing a portion of test of the DUT 40 independently of the tester 22.

The configuration and function of the BOST board 44 are described in more detail by turning again to FIGS. 1A and 1B.

As shown in FIG. 1B, the BOST board 44 has a BOST board substrate 50, and a connector 52. A plurality of terminals to be electrically connected to the terminals provided in the BOST socket 46 are provided in the connector 52. As shown in FIG. 1A, an ADC/DAC measurement section 54, a control section 56, a DSP (digital signal processor) analysis section 58, a power supply section 60, and a memory section 62 are mounted on the BOST board 50.

The ADC/DAC measurement section 54 is a unit for outputting a digital or analog test signal to the DUT 40 by way of a specific terminal provided in the connector 52. The ADC/DAC measurement section 54 also receives, by way of a specific terminal provided in the connector 52, an analog response signal produced in the DUT 40 by means of digital-to-analog conversion, or a digital response signal produced in the DUT 40 by means of analog-to-digital conversion. The thus-received response signal is sequentially recorded in different address locations within the memory 62 and analyzed by a DSP analysis section 58 at a predetermined timing.

The DSP analysis section 58 determines whether or not individual response signals recorded in the memory section 62 are appropriate. If the response signals are determined to be appropriate, a DAC (digital-to-analog converter) or an ADC (analog-to-digital converter) provided in the DUT 40 is determined to be normal. In contrast, if the response signal is determined to be inappropriate, the DAC or ADC provided in the DUT 40 is determined to be anomalous. The DSP analysis section 58 supplies a result signal representing the result of determination to the tester 22 from the specific pin 34 by way of a specific terminal provided in the connector 52.

The power supply section 60 is a unit which receives required power from the universal power supply 28 of the tester 22 and supplies to individual units mounted on the BOST board 44 power required for performing processing. The control section 56 is a unit which controls operation of the ADC/DAC measurement section 54, that of the DSP analysis section 58, or that of the memory section 62 for implementing the above-described processing on the BOST board 44.

In the present embodiment, when the DUT 40 is tested, a control signal pertaining to a test analysis number and various codes is supplied to the BOST board 44 from the tester 22. In the present embodiment, the tester 22 produces the control signal in the same manner as that in which the test signal is supplied to the DUT 40. More particularly, the tester 22 causes the TPG 26 to produce a pattern corresponding to the control signal on the basis of test signal conditions described in a test program. The thus-produced control signal is supplied to the BOST board 44 by way of the corresponding pin 34, the DUT board 20, and the BOST socket 46. Accordingly, under the present method, there is no necessity of providing the tester 22 with a special unit for activating the BOST board 44.

As mentioned above, under the test method according to the present embodiment, an analog circuit (i.e., a DAC or ADC) provided in the DUT 40 can be tested through use of the BOST board 44 that is detachable from and attachable to the DUT board 20, as well as through use of the TPG 26 and the pin electronic section 36 provided on the popular tester 22 as standard equipment. Further, a digital circuit provided in the DUT 40 can be tested appropriately by means of utilization of popular functions of the tester 22. According to the test method and the external test auxiliary device (BOST board 44), the DUT 40 including both an analog circuit and a digital circuit can be tested without being limited by the specifications and performance of the tester 22.

As mentioned above, in the present embodiment, a wiring path to be established between the BOST board 44 and the DUT 40 can be sufficiently shortened by means of mounting the BOST board 44 on the DUT board 20. For this reason, by means of the test method and the external test auxiliary device (i.e., the BOST board 44) according to the first embodiment, the precision of testing of the DUT 40 can be improved by means of shortening the path of an analog measurement system and diminishing factors responsible for an error in measurement.

In the present embodiment, measurement functions which are not provided in the tester 22 are implemented on the BOST board 44, thereby readily expanding the functions of the tester 22 without involvement of high costs. As compared with a case where the tester 22 is provided with all the functions required for testing the DUT 40, the test method and the external test auxiliary device (BOST board 44) according to the present embodiment can diminish costs incurred for developing a semiconductor device, by means of greatly diminishing costs of a test system.

Second Embodiment

A second embodiment of the present invention will now be described by reference to FIG. 4.

Figure 4:
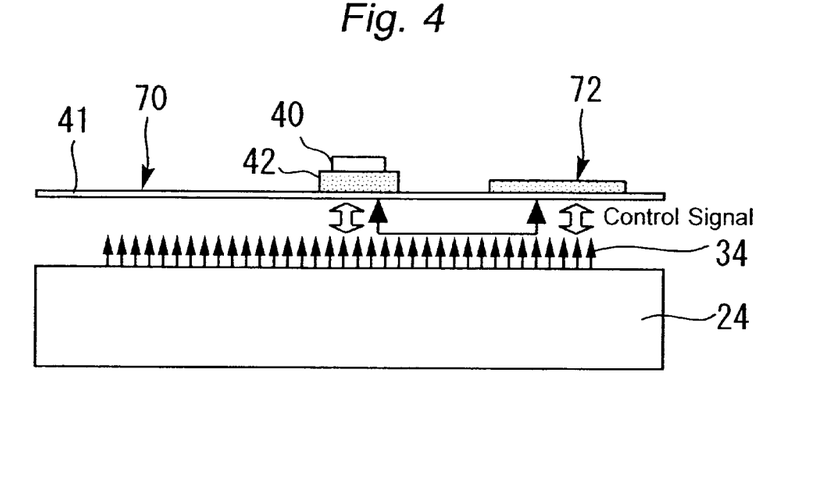
FIG. 4 is a side view showing a DUT board which has BOST circuits combined thereon and acts as an external test auxiliary device according to a second embodiment of the present invention.

FIG. 4 shows a DUT board 70 which has BOST circuits combined thereon and acts as an external test auxiliary device according to the second embodiment. The DUT board 70 according to the embodiment is identical in configuration with the DUT board 20 described in connection with the first embodiment, except that a BOST circuit 72 is mounted directly on the DUT board substrate 41. Here, the BOST circuit 72 has the same circuit as that formed on the BOST board 44 described in connection with the first embodiment.

The external test auxiliary device according to the present embodiment (i.e., the DUT board 70) obviates use of the connector 52 and the BOST socket 46. In contrast with the first embodiment, the present embodiment enables further simplification of a wiring route interposed between the BOST circuit and the DUT 40. Hence, the external test auxiliary device according to the present embodiment enables a greater improvement in the precision of test of the DUT 40 as compared with the external test auxiliary device according to the first embodiment.

Third Embodiment

By reference to FIGS. 5A through 5D, a third embodiment of the present invention will now be described.

Figure 5A:
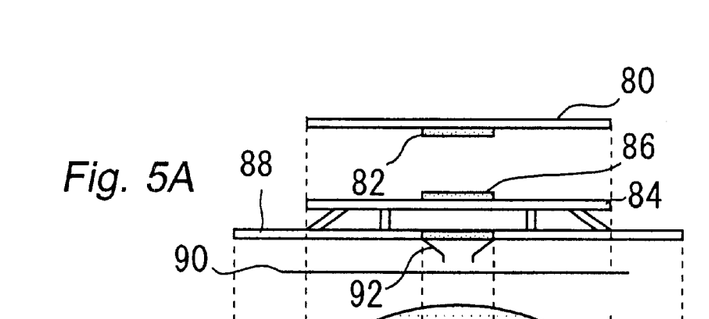
FIG. 5A is a side view showing a BOST board acting as an external test auxiliary device according to a third embodiment of the present invention.
Figure 5B:
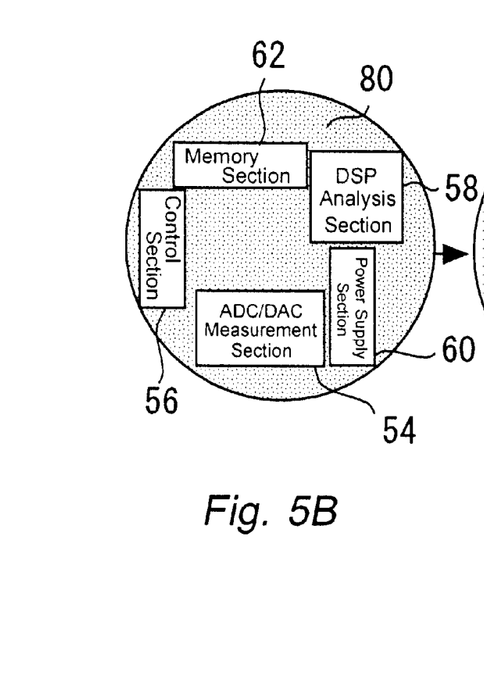
FIGS. 5B through 5D are exploded views of the BOST board when viewed the top.
Figures 5C, 5D:
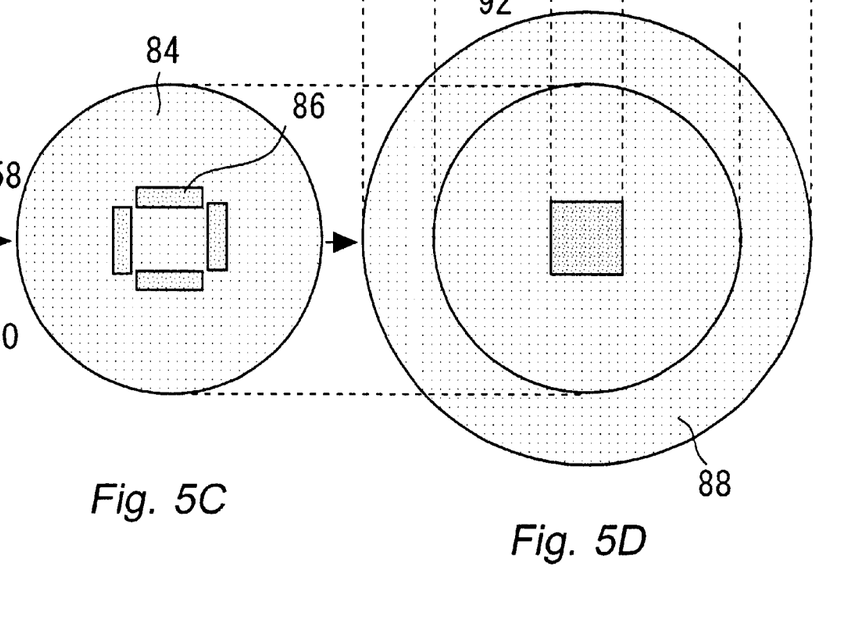

FIGS. 5A through 5D are illustrations for describing an external test auxiliary device according to the present embodiment. More specifically, FIG. 5A is a side view of a BOST board 80 acting as an external test auxiliary device according to the present embodiment. FIGS. 5B through 5D are exploded views of the BOST board 80 when viewed from the top.

As shown in FIG. 5A, the BOST board 80 is equipped with a connector 82. A BOST interface board 84 disposed below the BOST board 80 is equipped with a BOST socket 86 which is to fit to the connector 82. By means of the connector 82 being fitted to the BOST socket 86, the BOST board 80 is mounted on the BOST interface board 84.

The BOST interface board 84 is mounted on a probe card 88. A wiring element for establishing a desired electrical connection between terminals of the BOST socket 86 and the probe card 88 is formed between the BOST interface board 84 and the probe card 88. As shown in FIG. 5A, when the connector 82 of the BOST board 80 is fitted to the BOST socket 86, terminals provided in the connector 82 are connected to the probe card 88 appropriately.

As shown in FIG. 5B, the ADC/DAC measurement section 54, the control section 56, the DSP analysis section 58, the power supply section 60, and the memory section 62 are mounted on the BOST board 80, as in the case of the first embodiment. Accordingly, the BOST board 80 functions in the same manner as the BOST board 44 described in connection with the first embodiment.

The probe card 88 is an interface used for testing a semiconductor device (chip) fabricated on a semiconductor wafer 90. A probe 92 for establishing an electrical connection with the semiconductor device provided in the wafer 90 is provided on the under surface, i.e., on a lower side in FIG. 5A of the probe card 88. A connection terminal (not shown) to be electrically connected to a plurality of pins provided on a test head of the tester is provided on the front surface, i.e., an upper side in FIG. 5A of the probe card 88. In the present embodiment, there must be employed a test head having pins arranged annularly so as to avoid interference with the BOST interface board 84. The connection terminal provided on the surface of the probe card 88 is provided annularly in the vicinity of the outer periphery of the probe card 88 so as to correspond to the pins.

In the present embodiment, the relative positional relationship between the probe card 88 and the semiconductor wafer 90 (DUT) is changed in accordance with the position of a chip to be measured, as required. For example, when a chip provided in the center of the semiconductor wafer 90 is an object of measurement, the positional relationship between the probe card 88 and the semiconductor wafer 90 is adjusted, as shown in FIG. 5A. Subsequently, the probe 92 comes into contact with the chip, whereupon testing of the chip is commenced.

In the present embodiment, the BOST board 80 can determine whether or not a DAC or ADC provided in a chip to be measured operates properly, and supply the result of determination as a result signal to the tester. Under the test method according to the third embodiment, there can be yielded the same superior advantage as that yielded in the first embodiment when the semiconductor wafer 90 is a DUT and the probe card 88 is used as an interface.

Fourth Embodiment

A fourth embodiment of the present invention will now be described by reference to FIGS. 6A and 6B.

Figure 6A:
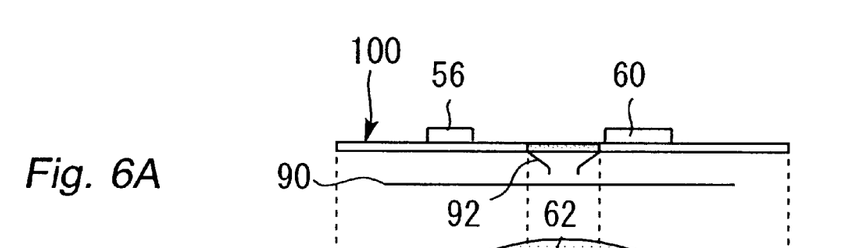
FIG. 6A is a side view showing a probe card which has BOST circuits mixed thereon and acts as an external test auxiliary device according to a fourth embodiment of the present invention.
Figure 6B:
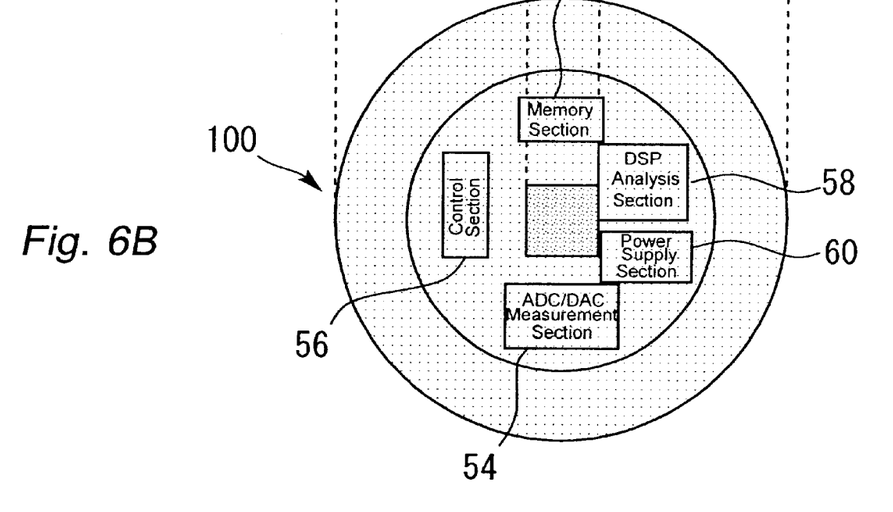
FIG. 6B is a plan view of the probe card shown in FIG. 6A.

FIG. 6A is a side view of a probe card 100 which has BOST circuits mixed thereon and acts as an external test auxiliary device according to the fourth embodiment. FIG. 6B is a plan view of the probe card 100 shown in FIG. 6A. In the present embodiment, the probe card 100 is identical in configuration with that described in connection with the third embodiment, except that constituent elements of the BOST circuit (e.g., the ADC/DAC measurement section 54) are mounted directly on the probe card 100.

The external test auxiliary device according to the present embodiment (i.e., the probe card 100) obviates use of the connector 82 and the BOST socket 86. Hence, a wiring path disposed between the BOST circuit and the semiconductor wafer 90 can be simplified to a greater extent in the present embodiment than in the third embodiment. Therefore, the external test auxiliary device according to the present embodiment can enhance the precision of test of a DUT to a much greater extent.

Fifth Embodiment

A fifth embodiment of the present invention will now be described by reference to FIGS. 7 through 10.

Figure 7:
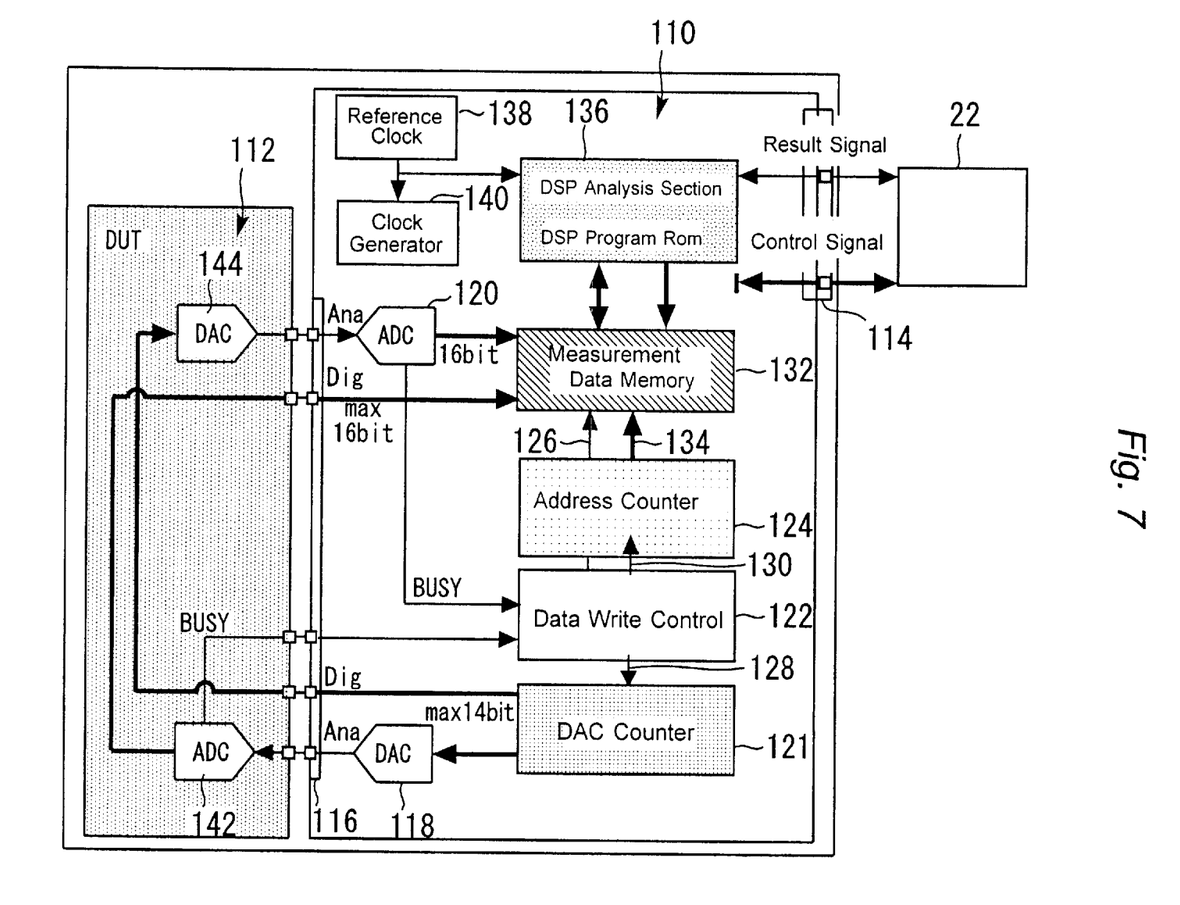
FIG. 7 is a block diagram for describing the structure of a principal section of a BOST circuit and a DUT used in a fifth embodiment of the present invention.

FIG. 7 is a block diagram for describing the structure of a principal section of a BOST circuit 110 and a DUT 112 used in the fifth embodiment. The BOST circuit 110 shown in FIG. 7 can be utilized with any one of the external test auxiliary devices described in connection with the first through fourth embodiments.

As shown in FIG. 7, the BOST circuit 110 is provided with a first BOST interface 114 and a second BOST interface 116. The BOST circuit 110 can exchange a result signal and a control signal with the tester 22 by way of the first BOST interface 114. Further, the BOST circuit 110 can exchange a test signal and a response signal with the DUT 112 by way of the second BOST interface 116.

A DAC 118 and an ADC 120 are provided in the BOST circuit 110. The DAC 118 is a unit for converting a test signal delivered in digital form into an analog test signal and supplying the analog test signal to the second BOST interface 116. The ADC 120 is a unit for converting a response signal supplied from the second BOST interface 116 in analog form into a digital response signal. The DAC 118 and the ADC 120 correspond to the ADC/DAC measurement section 54 described in connection with the first through fourth embodiments.

The BOST circuit 110 has a DAC counter 121, a data write control section 122, and an address counter 124. The DAC counter 121 is a unit for producing, in digital form, a test signal to be supplied to the DUT 112. The digital test signal produced by the DAC counter 121 is supplied in its present form directly to the second BOST interface 116 or is supplied to the second BOST interface 116 after having been converted to analog form, in accordance with details of a test to be conducted.

The data write control section 122 is a unit which produces a write signal 126, a DAC count signal 128, and an address count signal 130 upon receipt of a busy signal to be described later. The write signal 126 is an instruction signal to be used for recording a response signal output from the DUT 112 into measurement data memory 132 to be described later. The DAC count signal 128 is for instructing, to the DAC counter 121, a change in an instruction signal to be produced. Further, the address count signal 130 is for instructing, to the address counter 124, a change in a record address into which a response signal is to be recorded. The DAC counter 121, the data write control section 122, and the address counter 124 correspond to the control section 56 described in connection with the first through fourth embodiments.

The BOST circuit 110 is equipped with the measurement data memory 132. The measurement data memory 132 is a unit corresponding to the memory section 62 described in connection with the first through fourth embodiments. The measurement data memory 132 receives a response signal delivered from the DUT 112 in digital form or a response signal which is supplied in analog form from the DUT 112 and converted to digital form by the ADC 120. The measurement data memory 132 records the response signal (i.e., a digital signal) into the area specified by an address 134 instructed by the address counter 124, in accordance with an instruction of the write signal 126.

The BOST circuit 110 has a DSP analysis section 136 including DSP program ROM. The DSP analysis section 136 corresponds to the DSP analysis section 58 described in connection with the first through fourth embodiments. The DSP analysis section 136 analyzes at predetermined timing data pertaining to the response signal recorded on the measurement data memory 132, and outputs a result signal representing the result of analysis to the tester 22.

The BOST board 110 includes a reference clock circuit 138 for producing a reference clock signal to be used for activating the DSP analysis section 136 and a clock signal generation circuit 140 for producing a clock signal to be used for activating another unit.

The DUT 112 shown in FIG. 7 has built therein an ADC 142 and a DAC 144. The ADC 142 is a circuit for converting a digital signal into an analog signal within the DUT 112. The DAC 144 is a circuit for converting an analog signal into a digital signal within the DUT 112.

In the present embodiment, a digital test signal output from the DAC counter 121 of the BOST circuit 110 is input to the DAC 144 of the DUT 112. Further, after having been converted into an analog signal by means of the DAC 144, the test signal is input to the ADC 120 of the BOST circuit 110 as an analog response signal. The ADC 120 converts the thus-input response signal into a digital signal and supplies the digital signal to the measurement data memory 132. At the time of conversion of the response signal, the ADC 120 outputs a busy signal indicating that an analog-to-digital conversion operation is in progress. The thus-output busy signal is delivered to the data write control section 122. Upon receipt of the busy signal, the data write control section 122 produces the write signal 126, the DAC count signal 128, and the address count signal 130.

In the present embodiment, the test signal which is converted into an analog signal by the DAC 118 after having been output from the DAC counter 121 of the BOST circuit 110 is supplied to the ADC 142 of the DUT 112. The test signal is converted into a digital response signal by means of the ADC 142. The thus-produced digital response signal is supplied directly to the measurement data memory 132 by way of the second BOST interface 116. In the present embodiment, the ADC 142 of the DUT 112 outputs a busy signal indicating that conversion operation is in progress, when converting the analog signal into a digital signal. The thus-output busy signal is supplied to the data write control section 122. Upon receipt of the busy signal, the data write control section 122 produces the write signal 126, the DAC count signal 128, and the address count signal 130 in the manner as mentioned previously.

Figure 8:
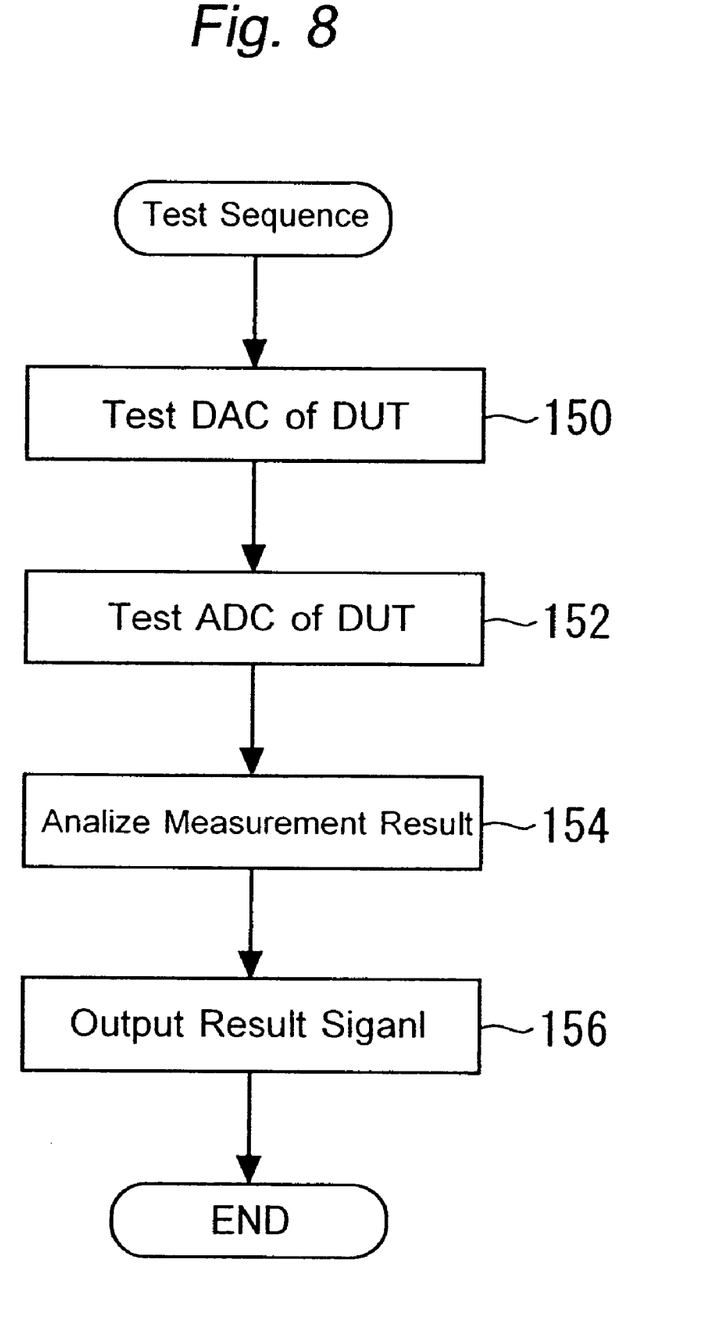
FIG. 8 is a flowchart showing one example of procedures required when a DUT is tested through use of the BOST circuit shown in FIG. 7.

FIG. 8 is a flowchart showing one example of procedures required when the DUT 112 is tested through use of the BOST circuit 110 shown in FIG. 7.

In the example shown in FIG. 8, the DAC 144 of the DUT 112 is tested (step 150).

FIGS. 9A through 9H are timing charts showing waveforms of various signals produced during the course of testing of the DAC 144.

Figure 9A:
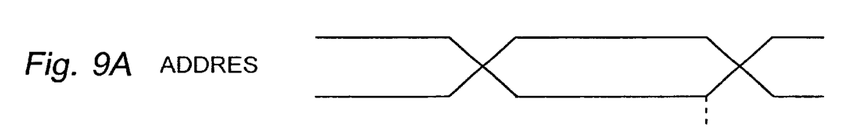
FIGS. 9A through 9H are timing charts showing waveforms of various signals produced during the course of testing of the DAC shown in FIG. 7.
Figure 9B:
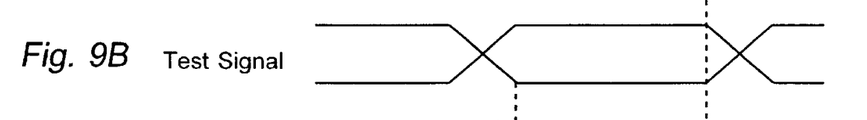
Figure 9C:
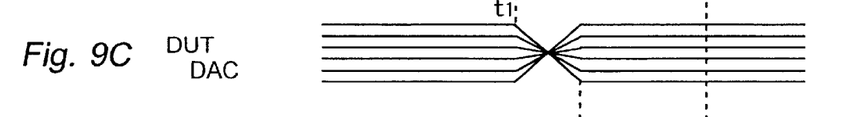

As shown in FIG. 9B, when the test signal output from the DUC counter 121 changes at time $t_1$, the change is reflected in an output from the DAC 144 provided in the DUT 122; that is, an analog response signal, as shown in FIG. 9C.

Figure 9D:
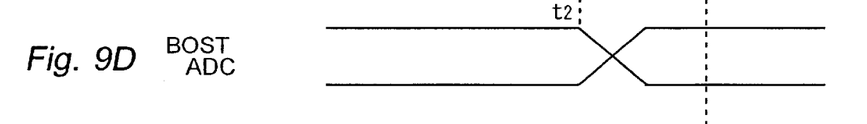
Figure 9E:
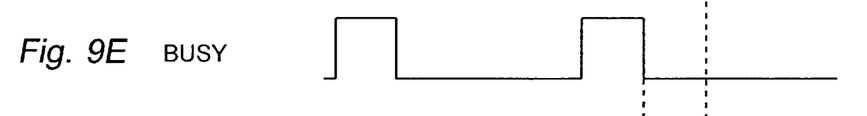

After the output from the DAC 144 provided in the DUT 112 has been stabilized, the ADC 120 provided in the BOST circuit 110 commences an analog-to-digital conversion operation from time $t_2$, as shown in FIG. 9D. At this time, the ADC 120 produces a busy signal until the analog-to-digital conversion operation has been completed, as shown in FIG. 9E.

Figure 9F:
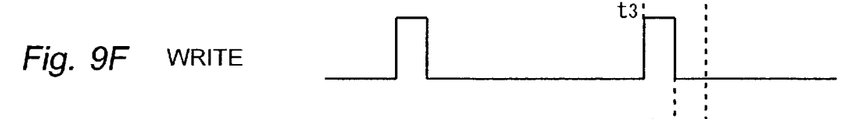

When the busy signal has disappeared at time t3, the data write control section 122 produces a write signal 126, as shown in FIG. 9F. Consequently, a response signal which has been appropriately converted into a digital form by means of the ADC 120 is written in a certain address region in the measurement data memory 132.

Figure 9G:
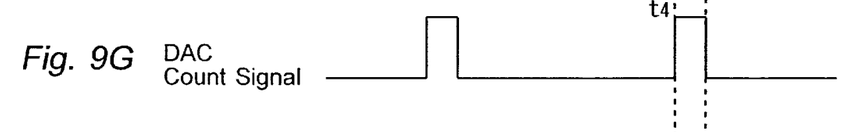
Figure 9H:
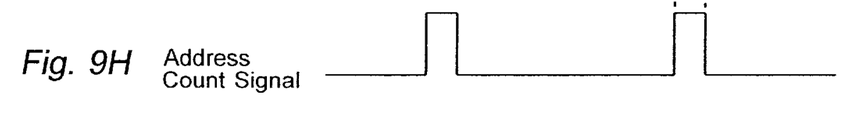

When the write signal has disappeared at time t4, the data write control section 122 produces the DAC count signal 128 and the address count signal 130, as shown in FIGS. 9G and 9H. Consequently, as shown in FIG. 9A, an address into which the next response signal is to be written is changed. Further, as shown in FIG. 9B, the value of the test signal output from the DAC 118 is changed.

The foregoing processing operation is repeatedly performed until response signals pertaining to all test signals to be supplied to the DAC 144 of the DUT 112 are recorded. After completion of the processing, a test pertaining to the DAC 144 is terminated.

As shown in FIG. 8, after completion of testing of the DAC 144, the ADC 142 provided in the DUT 112 is tested. The ADC 142 is tested in substantially the same manner as the DAC 144.

In the test of the ADC 142, the test signal which has been converted into an analog signal by means of the DAC 118 is supplied to the ADC 142 provided in the DUT 112. The ADC 142 performs an analog-to-digital conversion operation while outputting a busy signal. When the analog-to-digital conversion operation has been completed, the busy signal is extinguished, and a digital response signal is supplied to the measurement data memory 132.

In synchronism with extinction of the busy signal, the data write control section 122 produces the write signal 126, and the converted response signal is recorded on the measurement data memory 132. Subsequently, the data write control section 122 produces the DAC count signal 128 and the address count signal 130, thereby updating the test signal and the address.

After the above-described processing has been repeated with regard to all the test signals to be supplied to the ADC 142 of the DUT 112, testing of the DUT 142 is completed. After completion of testing, there are performed analysis of a measurement result and output of a result signal in the manner as shown in FIG. 8 (steps 154 and 156).

Processing pertaining to steps 154 and 156 are performed in the DSP analysis section 136. More specifically, the DSP analysis section 136 first reads data pertaining to the response signals recorded in the measurement data memory 132 and determines whether or not the response signals have correct values. When the response signal produced by the DAC 144 and the response signal produced by the ADC 142 assume appropriate values, the DAC 144 and the ADC 142 are determined to be normal. In contrast, if an anomalous response signal is detected, the DAC 144 or ADC 142 is determined to be anomalous. After completion of determination operation, the DSP analysis section 136 transmits, to the tester 22, a result signal representing the result of analysis.

The BOST circuit 110 according to the present embodiment optimizes a timing at which a response signal is to be written, a timing at which a test signal is to be updated, and a timing at which a write address of a response signal is to be updated, by utilization of a busy signal produced when the ADC 120 provided in the BOST circuit 110 or the ADC 142 provided in the DUT 112 performs an analog-to-digital conversion operation. In contrast with a circuit which performs recording of data by setting a rough wait time without utilization of a busy signal, the BOST circuit 110 according to the present embodiment enables high-speed testing of the DUT 112.

As mentioned above, in the BOST circuit 110 according to the present embodiment, the response signals produced by the ADC 142 and the DAC 144 are analyzed by the DSP analysis section 136 provided in the BOST circuit 110 after having been recorded temporarily in the measurement data memory 132, in the manner as mentioned previously. The data uploaded to the tester 22 from the BOST circuit 110 are mere result signals indicating the statuses of the ADC 142 and the DAC 144. The present embodiment obviates a necessity of uploading the data recorded in the measurement data memory 132 from the BOST circuit 110 to the tester 22. For this reason, the BOST circuit 110 according to the present embodiment enables simplification of a method of establishing communication between the BOST circuit 110 and the tester 22 and sufficient shortening of the time required for testing the DUT 112.

An address signal to be used for specifying a location on the measurement data memory 132 into which a response signal is to be recorded can be produced in the BOST circuit 110. Accordingly, supply of such an address signal from the tester 22 to the BOST circuit 110 is not required. In addition, the BOST circuit 110 according to the present embodiment has a function required for performing an analog test. Hence, testing of the DUT 112 can be carried out while a high degree of self-control is realized. The BOST circuit 110 can minimize the number of control signals to be supplied from the outside and reduce the number of pins required for measuring a single DUT 112. Accordingly, the BOST circuit 110 according to the present embodiment enables an increase in the number of DUTs which can be simultaneously tested by a single tester.

Sixth Embodiment

Figure 10:
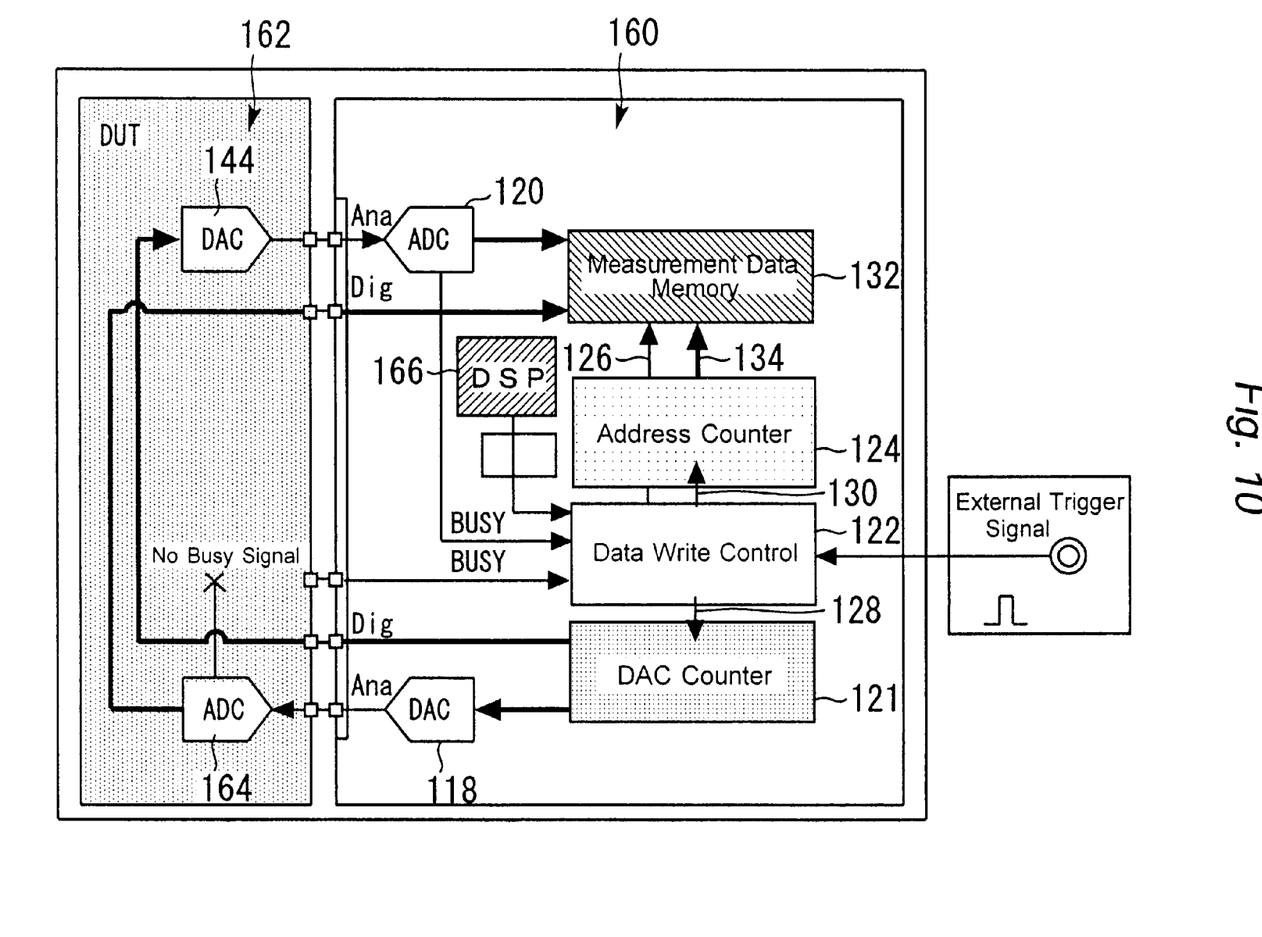
FIG. 10 is a block diagram for describing the structure of the principal section of a BOST circuit and that of a DUT used in a sixth embodiment of the present invention.

A sixth embodiment of the present invention will now be described by reference to FIG. 10. FIG. 10 is a block diagram for describing the structure of the principal section of a BOST circuit 160 and that of a DUT 162 used in the present embodiment. The BOST circuit 160 shown in FIG. 10 can be utilized with any one of the external test auxiliary devices described in connection with the first through fourth embodiments.

As shown in FIG. 10, the DUT 162 to be used in the present embodiment has an ADC 164 which cannot output a busy signal. Hence, the BOST circuit 160 cannot receive a busy signal from the DUT 162 during a period of time in which the ADC 164 performs an analog-to-digital conversion operation.

In order to support the DUT 162 which does not have any function of outputting such a busy signal, the BOST circuit 160 according to the present embodiment has the function of supplying a trigger signal to the data write control section 122 from an external circuit or a DSP 166. The trigger signal is used for causing the data write control section 122 to produce the write signal 126, the DAC count signal 128, and the address count signal 130 in place of a busy signal supplied from the DUT 162.

According to the BOST circuit 160, there can be implemented the same function as that yielded in the fifth embodiment, so long as a trigger signal is supplied to the data write control section 122 from an external circuit or the DSP 166 in synchronism with a period during which the ADC 164 of the DUT 162 performs an analog-to-digital conversion operation. Accordingly, the BOST circuit 160 according to the present embodiment supports a DUT which does not output a busy signal and can yield the same advantage as that yielded in the fifth embodiment.

Since the present invention is embodied in the manner as mentioned previously, the following advantages are yielded.

According to a first aspect of the present invention, an external test auxiliary device having a BOST board substrate, an external self-test circuit, and a connector can be readily mounted on an interface board, e.g., a DUT board or a probe card, by way of the connector. The external self-test circuit employed in the present invention enables easy implementation of a test system which can establish a short path between a DUT and an external self-test circuit, increase the processing speed of a tester, and expand the function of the tester.

According to a second aspect of the present invention, the external self-test circuit is formed directly on a DUT board or a probe card. Such a DUT board or probe card enables easy implementation of a test system which can increase processing speed of a low-cost tester or expand the function of the tester.

According to a third aspect of the present invention, testing of an analog circuit including a digital-to-analog converter provided in the DUT can be facilitated.

According to a fourth aspect of the present invention, the test speed of the DUT including the digital-to-analog converter can be increased by utilization of a busy signal.

According to a fifth aspect of the present invention, testing of an analog circuit including an analog-to-digital converter provided in the DUT can be facilitated.

According to a sixth aspect of the present invention, the test speed of the DUT including the analog-to-digital converter can be increased by utilization of a busy signal.

According to a seventh aspect of the present invention, even when a DUT having an analog-to-digital converter incapable of outputting a busy signal is an object of testing, the DUT can be tested at high speed.

According to a eighth aspect of the present invention, a semiconductor device can be tested at high speed and accurately through use of a low-cost test system.

Further, the present invention is not limited to these embodiments, but variations and modifications may be made without departing from the scope of the present invention.

The entire disclosure of Japanese Patent Application No. 2001-32849 filed on Feb. 8, 2001 including specification, claims, drawings and summary are incorporated herein by reference in its entirety.

What is claimed is:

1. An external test auxiliary device for use in testing a semiconductor device, the auxiliary device comprising:
    a connector having a plurality of terminals;
    a BOST (built-off self-test) board substrate having the connector mounted thereon; and
    an external self-test circuit formed on the BOST board substrate, wherein
        the external self-test circuit includes
            a test signal transmission section which transmits a predetermined test signal to a specific terminal provided in the connector on the basis of a control signal input from the specific terminal provided in the connector;
            a response signal receiving section which, in response to the test signal, receives a response signal input to a specific terminal provided in the connector;
            a signal analysis section which analyzes the response signal, thereby determining whether or not the signal is an appropriate signal; and
            a result signal transmission section which transmits, to a specific terminal provided in the connector, a test result signal representing whether or not the response signal is appropriate; wherein the test signal transmission section includes a digital transmission section for transmitting a digital signal as the test signal, and the response signal receiving section includes an analog-to-digital converter which receives an analog signal input in response to the digital signal as a response signal and converts the response signal into a digital signal.

2. The external test auxiliary device according to claim 1, further comprising:

a busy signal generation section which produces a first busy signal indicating a timing at which the analog-to-digital converter is to convert an analog response signal into a digital signal;

first recording means for recording a digital signal output from the analog-to-digital converter in accordance with the first busy signal;

first address change means for changing an address into which a digital signal output from the analog-to-digit converter is to be recorded, in accordance with the first busy signal; and first change means for changing a digital signal transmitted from the test signal transmission section, in accordance with the first busy signal.

3. An external test auxiliary device for use in testing a semiconductor device, the auxiliary device comprising:

a connector having a plurality of terminals;

a BOST (built-off self-test) board substrate having the connector mounted thereon; and an external self-test circuit formed on the BOST board substrate, wherein the external self-test circuit includes a test signal transmission section which transmits a predetermined test signal to a specific terminal provided in the connector on the basis of a control signal input from the specific terminal provided in the connector;

a response signal receiving section which, in response to the test signal, receives a response signal input to a specific terminal provided in the connector;

a signal analysis section which analyzes the response signal, thereby determining whether or not the signal is an appropriate signal; and a result signal transmission section which transmits, to a specific terminal provided in the connector, a test result signal representing whether or not the response signal is appropriate; wherein the test signal transmission section has a digital-to-analog converter which converts a digital signal into an analog signal and sends the analog signal as the test signal, and the response signal receiving section has a digital receiving section for receiving, as the response signal, a digital signal input in response to the analog test signal.

4. The external test auxiliary device according to claim 3, further comprising:

a busy signal receiving section for receiving, from the semiconductor device or the semiconductor wafer, a second busy signal representing a timing at which an analog test signal output from the digital-to-analog converter is to be converted into a digital signal in the semiconductor device or semiconductor wafer under test;

second recording mean for recording the digitally-input response signal in accordance with the second busy signal;

second address change means for changing an address in which the digitally-input response signal is to be recorded in accordance with the second busy signal; and second change means or changing the digital signal output from the test signal transmission section, in accordance with the second busy signal.

* * * * *

UNITED STATES PATENT AND TRADEMARK OFFICE
CERTIFICATE OF CORRECTION

PATENT NO. : 6,653,855 B2
DATED : November 25, 2003
INVENTOR(S) : Hisaya Mori et al.

It is certified that error appears in the above-identified patent and that said Letters Patent is hereby corrected as shown below:

Title page,
Item [73], Assignees, change "Mitsubishi Denki Kabushiki Kaisha, Tokyo (JP)" to
-- Renesas Technology Corp., Tokyo (JP) --

Signed and Sealed this

Sixteenth Day of March, 2004

JON W. DUDAS
*Acting Director of the United States Patent and Trademark Office*